United States Patent
Spisak

(10) Patent No.: US 7,680,618 B2
(45) Date of Patent: Mar. 16, 2010

(54) RANDOM EDGE CALIBRATION OF OVERSAMPLING DIGITAL ACQUISITION SYSTEM

(75) Inventor: Kevin C. Spisak, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 197 days.

(21) Appl. No.: 11/864,455

(22) Filed: Sep. 28, 2007

(65) Prior Publication Data
US 2009/0089000 A1    Apr. 2, 2009

(51) Int. Cl.
*G06F 19/00* (2006.01)
(52) U.S. Cl. ............... 702/107; 702/79; 702/89; 327/91; 327/94; 327/97
(58) Field of Classification Search ............ 702/79, 702/89, 85, 107; 327/91–97
See application file for complete search history.

(56) References Cited

U.S. PATENT DOCUMENTS

| | | | | |
|---|---|---|---|---|
| 4,713,621 A | * | 12/1987 | Nakamura et al. | 327/152 |
| 5,245,231 A | * | 9/1993 | Kocis et al. | 327/277 |
| 6,587,811 B2 | * | 7/2003 | Schleifer et al. | 702/176 |

* cited by examiner

*Primary Examiner*—Drew A Dunn
*Assistant Examiner*—Hien X Vo
(74) *Attorney, Agent, or Firm*—Francis I. Gray; Thomas F. Lenihan

(57) ABSTRACT

A calibration method for an oversampling acquisition system uses a digital calibration signal that has a period between edges that is unrelated to the period of a sample clock. The calibration signal in input in parallel to a plurality of samplers, each of which is clocked at a different time by a delayed version of the sample clock, to produce a plurality of sequential samples per sample clock period. Edge transitions of the calibration signal are counted that occur between adjacent ones of the samplers, and are accrued over an acquisition period to produce a plurality of edge counts. The edge counts are then processed to produce control signals to adjust the sample clock delay for each sampler so that the time intervals between the sequential samples are essentially uniform.

5 Claims, 2 Drawing Sheets

US 7,680,618 B2

RANDOM EDGE CALIBRATION OF OVERSAMPLING DIGITAL ACQUISITION SYSTEM

BACKGROUND OF THE INVENTION

The present invention relates to oversampling digital acquisition systems, and more particularly to calibration of the oversampling digital acquisition systems using a calibration signal having random edges relative to a sample clock.

In a digital acquisition system oversampling often is used to increase sample resolution. It is common to use a periodically clocked flip-flop to sample a digital signal, i.e., a bi-level signal where one level represents a logical "1" and the other level represents a logical "0". The resolution of this approach is limited by a maximum clock rate specified for the flip-flop. Oversampling overcomes this limitation by using multiple flip-flops to sample the digital signal in parallel. The clock input for each flip-flop is delayed by some fraction of the sample clock period to provide a range of sample points between sample clock edges. For example a clock period of 4.0 nanoseconds may be oversampled by eight flip-flops, with the sample clock being delayed by differing amounts—0.0 ns, 0.5 ns, 1.0 ns, . . . , 3.5 ns respectively—to produce an effective sample resolution of 500 picoseconds. The resolution of the oversampling system depends on the characteristics of the flip-flop, the number of flip-flops, the sample clock period and the accuracy of the individual clock delays.

The sample clock delay accuracy for each flip-flop is critical to sampling resolution improvement. The accuracy of these delays may be improved by including adjustable offset delays that are calibrated to minimize timing errors. This may be accomplished by sampling a calibration signal that has a period slightly longer or shorter than the sample clock period—4.01 ns or 3.99 ns relative to a 4.0 ns sample clock period. During each sample clock period the calibration signal precesses relative to the sample clock by the difference between the periods. The time difference between two oversampling points may then be calculated as the number of clock periods between transitions in the sample flip-flops multiplied by the rate of precession. This approach produces resolution on the order of picoseconds using crystal frequency references. However this approach is very sensitive to noise. Noise smears the transition of the calibration signal across many sample periods. System noise contributes two errors to actual data sampling: (i) it reduces the resolution of the sample flip-flops; and (ii) it compromises the resolution of the oversampling calibration.

What is desired is a method for calibrating an oversampling digital acquisition system that is not affected by random system noise to assure more accurate sampling time resolution.

SUMMARY OF THE INVENTION

Accordingly the present invention provides a calibration method for an oversampling acquisition system that uses a digital calibration signal that has a period between edges that is unrelated to the period of a sample clock. The calibration signal is input in parallel to a plurality of samplers, each of which is clocked at a different time by a delayed version of the sample clock, to produce a plurality of sequential samples per sample clock period. Edge transitions of the calibration signal are counted that occur between adjacent ones of the samplers, and are accrued over an acquisition period to produce a plurality of edge counts. The edge counts are then processed to produce control signals to adjust the sample clock delay for each sampler so that the time intervals between the sequential samples are essentially uniform.

The objects, advantages and other novel features of the present invention are apparent from the following detailed description when read in conjunction with the appended claims and attached drawing.

DETAILED DESCRIPTION OF THE DRAWING

Figure 1:
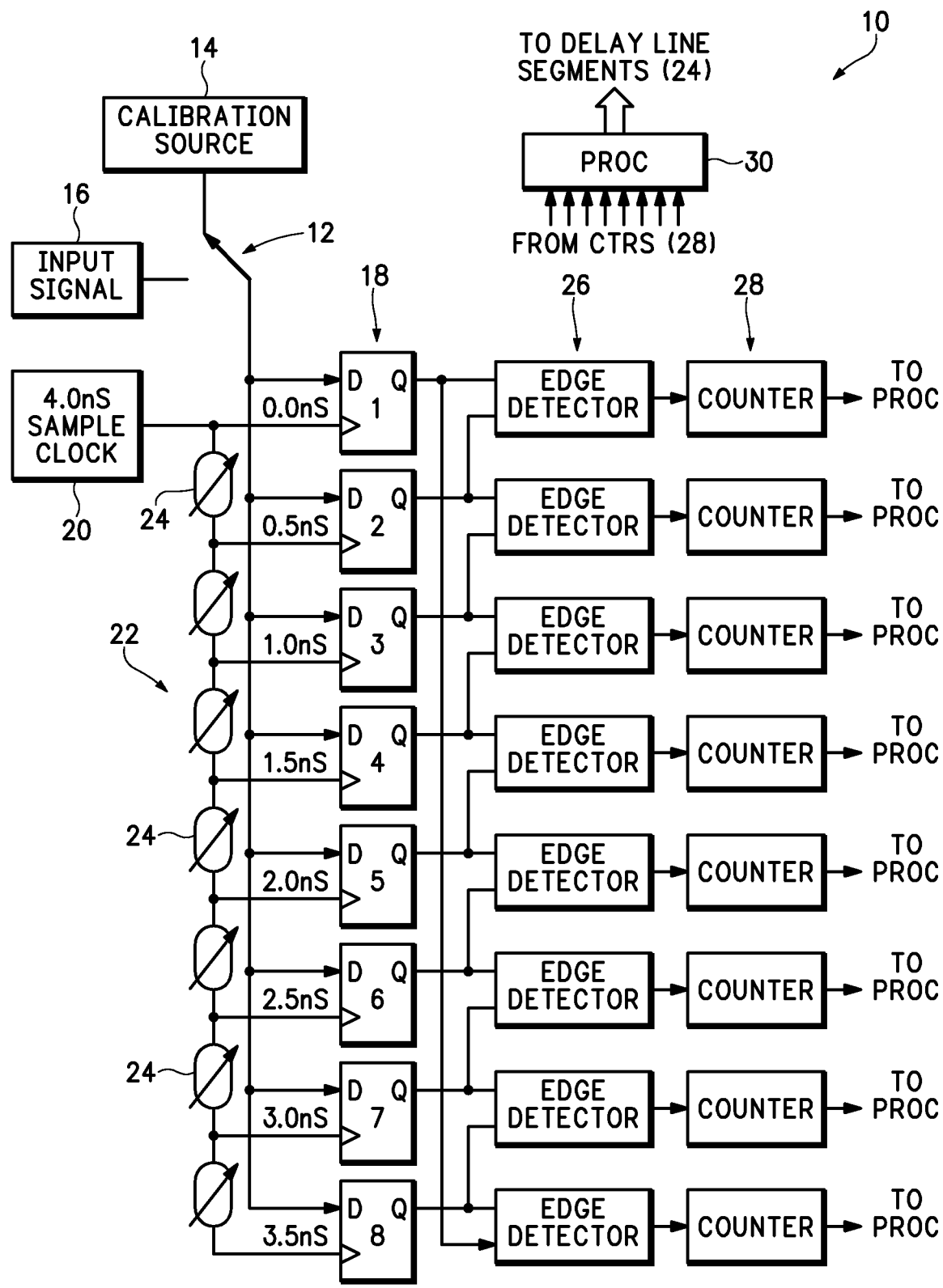
FIG. 1 is a block diagram view of a random edge calibration system for an oversampling digital acquisition system according to an embodiment of the subject invention.

Referring now to FIG. 1 a portion of an oversampling digital acquisition system 10 is shown. An input switch 12 selects as an input either a digital calibration signal from a calibration source 14 or a digital input signal 16 to be measured. The digital signal selected by the switch 12 is input in parallel to data inputs of a plurality of sampling flip-flops 18. Each sampling flip-flop 18 is clocked by a sample clock 20, the sample clock being delayed by a delay line 22 having a plurality of adjustable serial segments 24 so that the sample clock is applied to clock inputs of the sampling flip-flops in an ideally evenly timed sequence to provide a plurality of sequential samples of the digital input signal from the sampling flip-flops per period of the sample clock. When the input signal is the calibration signal, outputs from each of two adjacent sampling flip-flops 18 are input to respective edge detectors 26.

If the input signal has an edge in the time interval between the sampling of adjacent ones of the sampling flip-flops 18, i.e., transitions from one logical state to the other, the corresponding edge detector 26 detects the difference in states between the adjacent flip-flops. The edge detectors 26 may be setup to detect only transitions in one direction between the logic states, i.e., detect only leading edges or trailing edges, or may detect transitions in both directions, i.e., all edges. Coupled to outputs of the edge detectors 26 are respective counters 28. The counters 28 increment for each edge detected by the respective edge detector 26. When the edge detectors 26 are setup to detect both logic state transitions, the counters may either increment for all edges detected, whether leading or trailing edges, or may increment for leading edges and decrement for trailing edges or vice versa. After an acquisition is complete total counts from the counters 28 are analyzed by a processor 30, with the results being used to adjust the delays in each segment 24 of the delay line 22 so that the time interval between samples output from adjacent sampling flip-flops 18 is essentially equal. In other words for a sample clock 20 having a 4.0 ns period, the time interval between samples from eight sampling flip-flops 18 is adjusted to be 0.5 ns as shown.

The calibration signal from the calibration source 14, rather than having a period just slightly different from the period of the sample clock 20, has a period that is unrelated to that of the sample clock. For example the period of the calibration signal is not approximately an integer multiple or divisor of the period of the sample clock 20. The calibration signal may have a period of 10.1 ns when the period of the sample clock is 4.0 ns. Also the calibration signal may be subjected to a Gaussian jitter as well. The period of the calibration signal is preferably longer than the period of the sample clock, but may be shorter as well. The calibration signal is applied to the sampling flip-flops 18 until a sufficiently large count is accumulated by the counters 28 to provide the resolution needed for calibration. Acquisition of the calibration signal is then stopped and the counts for each edge detector 26 are processed by the processor 30.

The sum of all the counts equals the number of edges acquired. If the sampling flip-flops are evenly spaced in time, the counts from the respective counters 28 are essentially identical. However, if one of the sampling flip-flops 18 is sampling later in time than its nominal time, the count for the associated counter 28 is lower than the count for the preceding counter, which is then greater. The time difference between sampling flip-flops 18 is the edge count for the period between the sampling flip-flops divided by the total edge count multiplied by the sample clock period. For example with a sample clock period of 4.0 ns, an edge count between sampling flip-flops 18 of 350 and a total edge count of 2400, then the time separation between the adjacent sampling flip-flops is 350/2400*4=583 Ps with a best case resolution of 0.83 Ps. By starting with the first sampling flip-flop 18 and based upon the time differences determined for each adjacent pairs of sampling flip-flops, each segment 24 of the delay line 22 may be adjusted to provide a more accurate time difference approaching the ideal 500 Ps.

Under some circumstances the sampling flip-flops 18 may provide samples that are out of order or are sampled at approximately the same time. For example the illustrated 8× oversampling digital acquisition system 10 ideally has a sampling sequence of the sampling flip-flops 18 in the order 1, 2, 3, . . . , 8. However an uncalibrated oversampling digital acquisition system 10 may have a sampling sequence of the sampling flip-flops 18 in the order 1, 3, 2, 4, . . . , 8. This may appear as a "bounce" in the data, i.e., 00101111, rather than a clear state transition, i.e., 00011111. The sequential samples ideally are a series of "0"s followed by a series of "1"s, etc. To account for bounce additional constraints are included in the calibration portion of the oversampling digital acquisition system 10.

Figure 2:
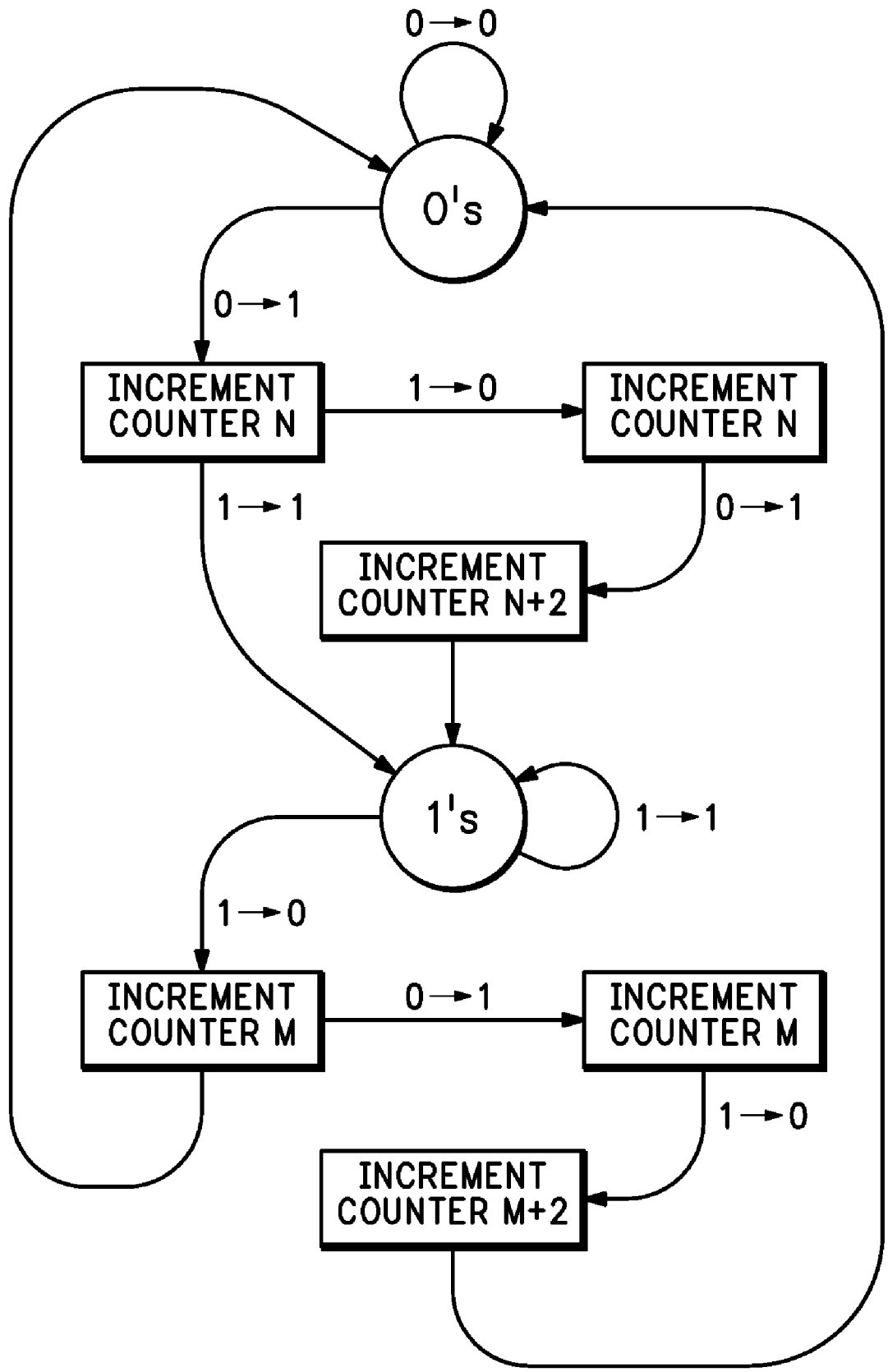
FIG. 2 is a state diagram for calibration of reversed counters in a random edge calibration system for an oversampling digital acquisition system according to an embodiment of the subject invention.

The oversampling digital acquisition system 10 needs to know what edge should occur between a certain number of consecutive 0s and a certain number of consecutive 1s. As shown in FIG. 2 if a certain minimum number of ones or zeros occur in sequence, i.e., two in the simplest case, the algorithm waits in the one or zero state until a transition occurs to the opposite state, as detected by one of the edge detectors 26. The transition results in the increment of the associated counter 28 by one. However if the next edge detector 26 in sequence indicates another transition back to the original state, the edge did not occur where it was indicated so the prior counter 28 is decremented and the next samples generally are in the same state. The algorithm then idles until the next edge is detected. In this way a sampling flip-flop 18 that is mis-timed is detected by the calibration process, and the proper counts are stored in the counters 26 for correcting the timing after the calibration acquisition is completed. The state diagram of FIG. 2 may be implemented by the processor 30 observing the outputs from the flip-flops 18 each sample clock period and providing a decrement count to the proper counter 28 when bounce is detected, or may be implemented by an appropriate hardware circuit.

Under the calibration system described in the Background above it is expected that there will be a number of edges detected in one subsample interval, which then precesses backward or forward to the next subsample interval but which may result in errors due to noise and result in too many detected edges in one subsample interval even though the correct number of samples actually occurred within the subsample interval. The present invention as described above spreads the edges over the subsample intervals so that the noise is essentially averaged out over the calibration acquisition interval. Thus the system noise does not effect the calibration of the sample clock delay line 22.

Thus the present invention provides for calibration of an oversampling acquisition system by using a digital calibration signal having a period that is unrelated to a sample clock, which calibration signal is applied to the oversampling flip-flops. The oversampling flip-flops have adjacent outputs coupled to edge detectors and associated counters to count edge occurrences between each of the flip-flops. After sufficient acquisition of the calibrated signal the counts are processed and converted into control signals for a sample clock delay line so that the samples are taken at approximately equal time intervals.

What is claimed is:

1. A method of calibrating an oversampling acquisition system, the oversampling acquisition system being of the type having a plurality of samplers clocked by delayed versions of a sample clock to produce a plurality of sequential samples per sample clock period, comprising the steps of:
   applying a digital calibration signal in parallel to the plurality of samplers, the digital calibration signal having a period that is unrelated to the sample clock period;
   detecting edges occurring between adjacent ones of the samplers over an acquisition period;
   counting the edges detected over the acquisition period to produce an edge count for each of the adjacent ones of the samplers; and
   adjusting delays for the sample clock to produce the delayed versions for each of the samplers as a function of the plurality of edge counts.

2. The method as recited in claim 1 further comprising the step of adjusting the edge counts to compensate for "bounce" in the sequential samples.

3. A calibration system for an oversampling acquisition system, the oversampling acquisition system being of the type having a plurality of samplers clocked by delayed versions of a sample clock to produce a plurality of sequential samples per sample clock period, comprising:
   a calibration signal source that provides a digital calibration signal for input to the samplers in parallel;
   a plurality of edge detectors equal to the number of samplers coupled to receive outputs from a pair of adjacent ones of the samplers, the edge detectors detecting edges in the digital calibration signal that occur between each of the adjacent ones of the samplers over an acquisition period;
   a plurality of counters, one for each of the edge detectors, coupled to count the edges detected by each of the edge detectors to produce an edge count for each of the edge detectors over the acquisition period; and
   means for processing the edge counts to generate control signals that produce the delayed versions so that a time interval between sequential samples from the samplers for each sample clock period is essentially uniform.

4. The system as recited in claim 3 further comprising means for adjusting the edge counts to compensate for "bounce" in the sequential samples.

5. A system for calibrating an oversampling digital acquisition system of the type having a plurality of sampling devices to which a signal is input which are timed to provide a plurality of equally time-spaced samples for the signal within one period of a sample clock comprising:

a calibration source switchably coupled in parallel for input to the sampling devices, the calibration source providing a digital calibration signal that has a signal which is unrelated to the period of the sample clock;

a plurality of edge detectors equal in number to the plurality of sampling devices having a pair of inputs coupled to outputs from consecutive ones of the sample devices for detecting when a digital transition occurs from one sampling device to the next;

a plurality of counters equal in number to the plurality of edge detectors coupled to count a number of edges detected by each of the edge detectors during acquisition of the digital calibration signal; and means coupled to outputs of the counters for determining time delays for the sample clock for each of the sampling devices to provide evenly time-spaced samples from the oversampling digital acquisition system.

* * * * *